United States Patent
Zhao

(10) Patent No.: US 9,190,481 B2
(45) Date of Patent: Nov. 17, 2015

(54) TRANSISTORS AND FABRICATION METHODS THEREOF

(71) Applicant: Semiconductor Manufacturing International (Shanghai) Corporation, Shanghai (CN)

(72) Inventor: Jie Zhao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/554,432

(22) Filed: Nov. 26, 2014

(65) Prior Publication Data

US 2015/0206949 A1 Jul. 23, 2015

(30) Foreign Application Priority Data

Jan. 21, 2014 (CN) .......................... 2014 1 0027709

(51) Int. Cl.
| | |
|---|---|
| *H01L 29/732* | (2006.01) |
| *H01L 29/49* | (2006.01) |
| *H01L 29/66* | (2006.01) |
| *H01L 29/78* | (2006.01) |
| *H01L 29/51* | (2006.01) |
| *H01L 21/3115* | (2006.01) |
| *H01L 21/3105* | (2006.01) |
| *H01L 21/3213* | (2006.01) |
| *H01L 21/02* | (2006.01) |
| *H01L 21/324* | (2006.01) |

(52) U.S. Cl.
CPC .......... *H01L 29/495* (2013.01); *H01L 21/0217* (2013.01); *H01L 21/02271* (2013.01); *H01L 21/31053* (2013.01); *H01L 21/31155* (2013.01); *H01L 21/324* (2013.01); *H01L 21/32134* (2013.01); *H01L 29/517* (2013.01); *H01L 29/66545* (2013.01); *H01L 29/78* (2013.01)

(58) Field of Classification Search
CPC ................... H01L 21/28194; H01L 21/31155; H01L 21/31053; H01L 21/32134; H01L 21/0217; H01L 21/02271; H01L 21/324; H01L 29/66545
USPC .......................................................... 438/183
See application file for complete search history.

(56) References Cited

U.S. PATENT DOCUMENTS

| | | | | |
|---|---|---|---|---|
| 7,422,936 B2* | 9/2008 | Barns | ................ | H01L 21/28079 257/E21.202 |
| 8,658,483 B2* | 2/2014 | Hsu | ....................... | H01L 29/401 257/369 |
| 2005/0032286 A1* | 2/2005 | Lee | ................... | H01L 21/28167 438/183 |

* cited by examiner

Primary Examiner — Hung Vu
(74) Attorney, Agent, or Firm — Anova Law Group, PLLC

(57) ABSTRACT

A method is provided for fabricating transistors. The method includes providing a substrate; and forming at least one dummy gate structure having a dummy gate dielectric layer and a dummy gate electrode layer on the substrate. The method also includes forming a dielectric film on the substrate and the dummy gate structure; and performing a thermal annealing process onto the dielectric film to increase the density of the interlayer dielectric film. Further, the method includes planarizing the dielectric film having the increased density until the top surface of the dummy gate structure is exposed; and forming a dense layer having an increased density on the dielectric film having the increased density. Further, the method also includes removing the dummy gate dielectric layer and the dummy gate electrode layer to form an opening; and forming a gate dielectric layer and a gate electrode layer sequentially in the opening.

15 Claims, 8 Drawing Sheets

TRANSISTORS AND FABRICATION METHODS THEREOF

CROSS-REFERENCES TO RELATED APPLICATIONS

This application claims the priority of Chinese patent application No. 201410027709.0, filed on Jan. 21, 2014, the entirety of which is incorporated herein by reference.

FIELD OF THE INVENTION

The present invention generally relates to the field of semiconductor manufacturing technology and, more particularly, relates to transistors and fabrication techniques thereof.

BACKGROUND

With the rapid development of integrated circuit (IC) technology, the size of the semiconductor devices of ICs, especially the metal oxide semiconductor (MOS) devices, has become smaller and smaller to match the requirements of device miniaturization and integration. When the size of the MOS transistor is continually shrunk, the process using the gate dielectric layer made of silicon oxide or silicon nitride meets certain challenges. For example, the transistors having the gate dielectric layer made of silicon oxide and silicon nitride face certain problems, such as the increase of leakage current, and/or the diffusion of the impurities, etc. Such problems may affect the threshold voltage of the transistors; and the performance of the semiconductor devices may be significantly affected.

In order to solve the above-mentioned problems, a high-K metal gate (HKMG) structure) has been introduced into the MOS transistors. The HKMG structure utilizes a high dielectric constant (high-K) material to substitute the conventionally used gate dielectric material, such as silicon oxide and silicon nitride, etc. The HKMG structure may reduce the leakage current of the transistor when the size of the transistor is reduced; and the performance of the transistor may be improved as well.

FIG. 1 illustrates an existing transistor having a high-K metal gate (HKMG) structure. As shown in FIG. 1, the transistor includes a semiconductor substrate 100 having a dielectric layer 105 and a gate structure 110. The top surface of the gate structure 110 levels with the top surface of the dielectric layer 105. The gate structure 105 includes a high-K dielectric layer 101 formed on the surface of the semiconductor substrate 100, a metal gate 103 formed on the surface of the high-K dielectric layer 101; and a sidewall spacer 104 formed on the side surface of the high-K dielectric layer 101 and the metal gate 103; and source/drain regions 106 formed in the semiconductor substrate 100 at both sides of the gate structure 110.

The HKMG structure 110 may be formed by a gate-last process. FIGS. 2-4 illustrate semiconductor structures corresponding to certain stages of an existing fabrication process of the transistor illustrated in FIG. 1. As shown in FIG. 2, the process includes providing a semiconductor substrate 100 and forming a dummy gate 120 on the surface of the semiconductor substrate 100. The dummy gate 120 includes a dummy gate dielectric layer 121 formed on the surface of the semiconductor substrate 100; a dummy gate layer 122 formed on the surface of the dummy gate dielectric layer 122, and the sidewall spacer 123 formed on the surface of the semiconductor substrate 100 at both sides of the dummy gate dielectric layer 121 and the dummy gate layer 122. A dielectric layer 105 may be formed on the surface of the semiconductor substrate 100; and the surface of the dielectric layer 105 levels with the surface of the dummy gate layer 122. Further, as shown in FIG. 3, after forming the dummy gate 120, the dummy gate layer 122 is removed; and an opening 124 is formed in the dielectric layer 105. Further, as shown in FIG. 4, after forming the opening 124, the dummy gate dielectric layer 122 on the bottom of the opening 124 may be removed.

The dummy gate layer 122 is usually made of poly silicon, and the semiconductor substrate 100 is usually made of silicon, thus the etching selectivity between the dummy gate layer 122 and the semiconductor substrate 100 may be very poor. In order to prevent the surface of the semiconductor substrate 100 from being damaged by a process for removing the dummy gate layer 122, the dummy gate dielectric layer 121 is formed between the semiconductor substrate 100 and the dummy gate layer 122. The dummy gate dielectric layer 121 is made of silicon oxide; and is formed by a thermal oxidation process. The silicon oxide layer formed by the thermal oxidation process may have a significantly high adhesion with the semiconductor substrate 100, thus it may aid the subsequent processes. However, the equivalent oxide thickness (EOT) of the silicon oxide layer formed by the thermal oxidation process may be relatively large, with the continuously shrinking of the size of the semiconductor devices; the dummy gate dielectric layer 121 on the bottom of the opening 124 may have adverse effect onto the subsequently formed transistors. Further, it may be difficult to control the thickness of the dummy gate dielectric layer 121 after removing the dummy gate layer 122. Therefore, after removing the dummy gate layer 122, the dummy gate dielectric layer 121 may need to be removed to expose the surface of the semiconductor substrate 100 so as to subsequently form an pad oxide layer, a gate dielectric layer and a gate electrode layer on the surface of the substrate 100 on the bottom of the opening 124.

However, the dielectric layer 105 is also usually made of silicon oxide, thus when the dummy gate dielectric layer 121 is removed, the dielectric layer 105 is also be thinned; and the sidewall spacer 123 is also etched with a certain thickness. Therefore, the surfaces of the dielectric layer 105 and the sidewall spacer 123 are not smooth and even. After subsequently forming high-K dielectric material and metal material in the opening 124, a polishing process may need to remove the dielectric material and the metal material on the dielectric layer 105. Because the surface of the dielectric layer 105 is not smooth and even, metal residues may be formed on the surface the dielectric layer 105 and the top surface of the sidewall spacer 123. Such residues may promote to form leakage current on the top of the metal gate 120; and the performance of the transistors may be significantly affected.

The disclosed device structures and methods are directed to solve one or more problems set forth above and other problems.

BRIEF SUMMARY OF THE DISCLOSURE

One aspect of the present disclosure includes a method for fabricating transistors. The method includes providing a substrate; and forming at least one dummy gate structure having a dummy gate dielectric layer and a dummy gate electrode layer on the substrate. The method also includes forming a dielectric film on a surface of the substrate and a top surface of the dummy gate structure; and performing a thermal annealing process onto the dielectric film to increase the density of the dielectric film. Further, the method includes planarizing the dielectric film having the increase density until the top surface of the dummy gate structure is exposed; and forming a dense layer having an increased density on the dielectric film. Further, the methods also includes removing the dummy gate dielectric layer and the dummy gate electrode layer to form an opening; and forming a gate dielectric layer and a gate electrode layer sequentially in the opening.

Another aspect of the present disclosure includes a transistor. The transistor includes a substrate; and a gate structure formed on a surface of the substrate. The transistor also include source/drain regions formed in the substrate at both sides of the gate structure; and a chemical etching stop layer having an increased density formed on the surface of the substrate and side surfaces of the gate structure. Further, the transistor includes an interlayer dielectric layer having an increased density formed on the chemical etching stop layer; and a dense layer formed having an increased density on the interlayer dielectric layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
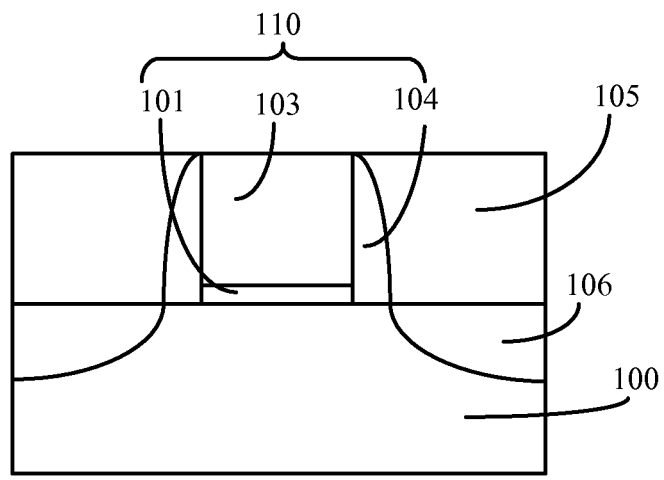
FIG. 1 illustrates an existing transistor having a high-K metal gate.
Figure 2:
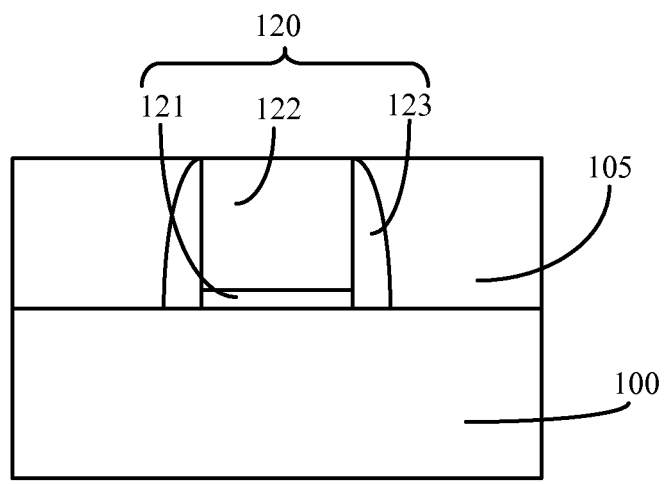
FIGS. 2~4 illustrate semiconductor structures corresponding to certain stages of an existing fabrication process of a high-K metal gate structure.
Figure 3:
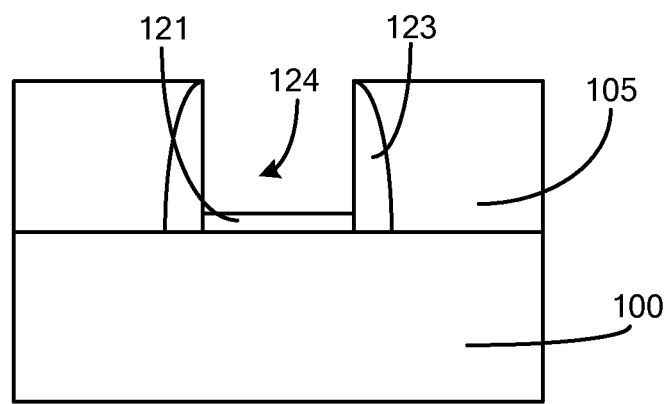
Figure 4:
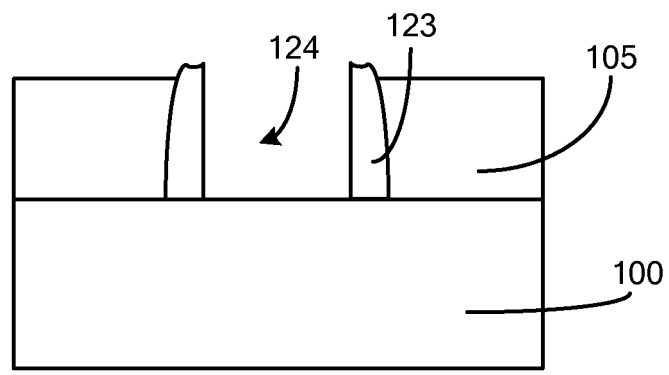
Figure 5:
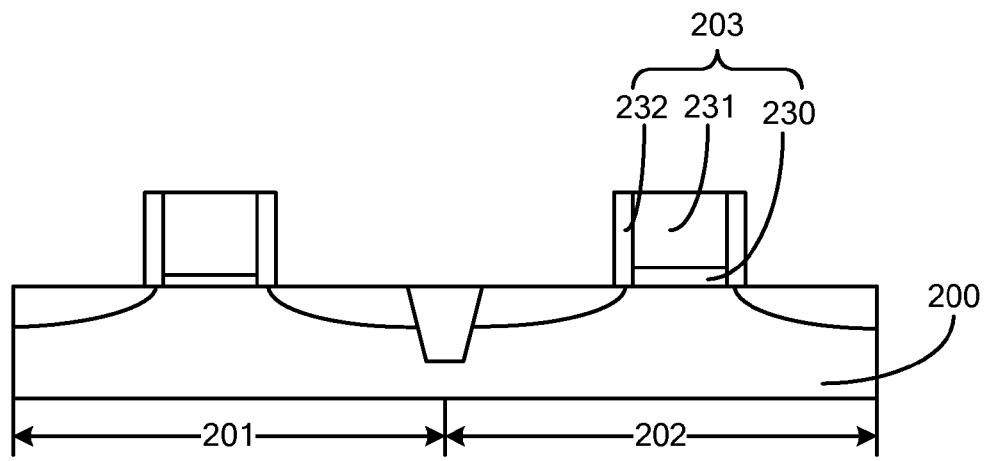
FIGS. 5~13 illustrate semiconductor structures corresponding to certain stages of an exemplary fabrication process of a transistor consistent with the disclosed embodiments.
Figure 12:
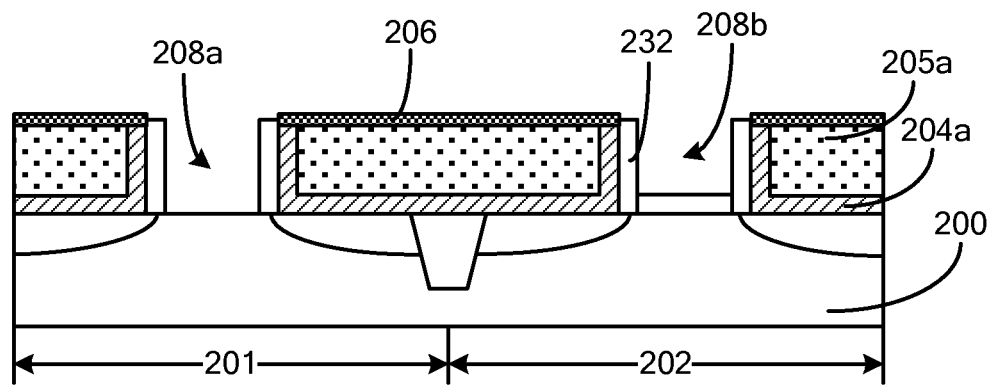
Figure 13:
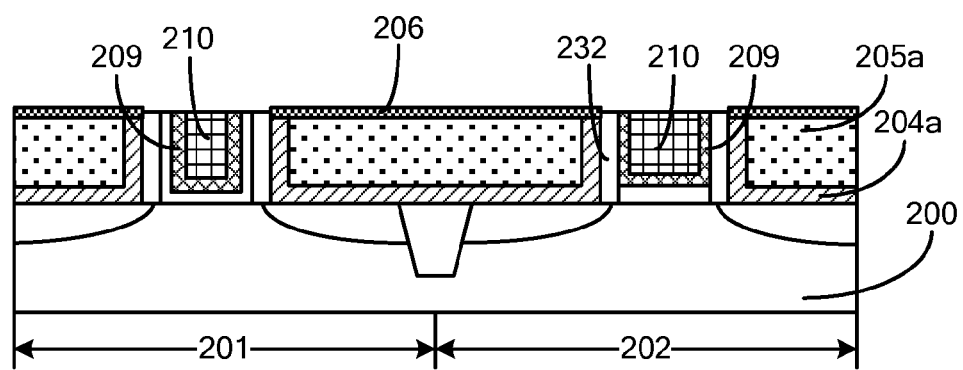
Figure 14:
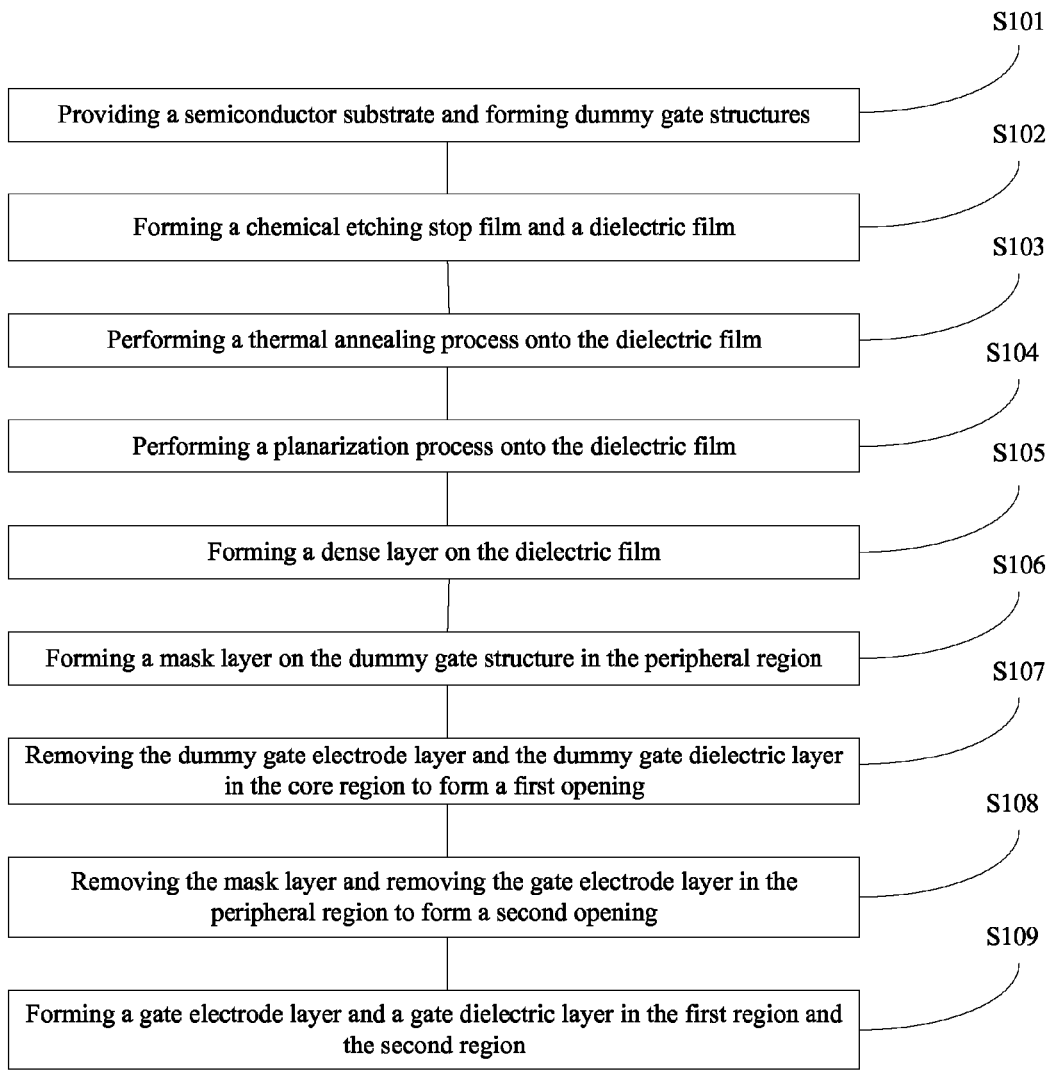
FIG. 14 illustrates an exemplary fabrication process of a transistor consistent with the disclosed embodiments.

FIG. 14 illustrates an exemplary fabrication process of a transistor; and FIGS. 5~13 illustrate exemplary semiconductor structures corresponding to various stages of the fabrication process consistent with the disclosed embodiments As shown in FIG. 14, at the beginning of the fabrication process, a substrate with certain structures is provided (S101). FIG. 5 illustrates a corresponding semiconductor structure.

As shown in FIG. 5, a semiconductor substrate 200 is provided. The substrate 200 may have a first region 201 and a second region 202. Further, an isolation structure (not labeled) may be formed between the first region 201 and the second region 202. Dummy gate structures 203 may be formed on the surface of the substrate 200 at both the first region 201 and the second region 202. The dummy gate structure 203 may include a dummy gate dielectric layer 230 formed on the surface of the substrate 200; and a dummy gate electrode layer 231 formed on the dummy gate dielectric layer 230.

The surface of the substrate 200 may be used to subsequently form transistor with high-K metal gate (HKMG) structures; and the HKMG structure may be formed by a gate last process, thus the dummy gate structures 203 may need to be formed on the surface of the substrate 200 firstly. The dummy gate structures 203 may be subsequently removed to form the HKMG structures.

In one embodiment, the first region 201 and the second region 202 may be used to form transistor with different types and/or functions. For example, the first region 201 may be used to form core devices, thus the first region 201 may be referred as a core region 201. The second region 202 may be used to form input/output devices, thus the second region 202 may be referred as a peripheral region 202. In certain other embodiments, the first region 201 may be used to form a PMOS transistor; and the second region may be used to form an NMOS transistor.

The substrate 200 may include any appropriate semiconductor materials, such as silicon, silicon on insulator (SOI), silicon germanium, carborundum, indium antimonide, lead telluride, indium arsenide, indium phosphide, gallium arsenidie, gallium antimonite, or ally semiconductor, etc. The substrate 200 may be also glass, etc. The substrate 200 provides a base for subsequent structures and processes.

In one embodiment, the substrate 200 may be a planar substrate. The dummy gate structures 203 may be formed on the planar surface of the semiconductor substrate 200.

In certain other embodiments, the substrate 200 may include a base substrate (not labeled), a plurality of fins (not shown) formed on the base substrate and an insulation layer (not shown) formed on the substrate and covering a portion of the side surface of the fins. The dummy gate structures 203 may stretch over the top surface of the fins and cover the top surface of the fins and a portion of the side surface of the fins. The dummy gate structure 203 may be insulated from the substrate by the insulation layer.

In one embodiment, the base substrate and the fins are portions of the substrate 200. The fins are formed by etching the substrate 200. The base substrate is the un-etched portion of the substrate 200.

In certain other embodiments, the base substrate may be the substrate 200; and the fins may be formed on the substrate 200. A process for forming the fins on the substrate 200 may include forming a semiconductor layer on the surface of the substrate 200; and followed by etching the semiconductor layer until the surface of the substrate 200 is exposed to form the fins. The semiconductor layer may be formed by any appropriate process, such as an epitaxial growth process, a chemical vapor deposition (CVD) process, a physical vapor deposition (PVD) process, or an atomic layer deposition (ALD) process, etc.

Referring to FIG. 5, the dummy gate structure 203 may provide a space for subsequently forming a gate dielectric layer and a gate electrode layer. The dummy gate dielectric layer 230 may be made of any appropriate material, such as silicon oxide, silicon nitride, or silicon oxynitride, etc. In one embodiment, the dummy gate dielectric layer 230 is made of silicon oxide. The dummy gate electrode layer 231 may be made of any appropriate material, such as poly silicon, or metal material, etc. In one embodiment, the dummy gate electrode layer 231 is made of poly silicon.

A process for forming the dummy gate structure 203 may include sequentially forming a dummy gate dielectric film on the surface of the semiconductor substrate 200, forming a dummy gate electrode film on the surface of the dummy gate dielectric film; forming a patterned photoresist layer defining the position of the dummy gate dielectric layer 230 and the dummy gate electrode layer 231; and etching the dummy gate dielectric film and the dummy gate electrode film until the surface of the substrate 200 is exposed using the patterned photoresist layer as an etching mask.

The dummy gate dielectric layer 230 may be able to protect the surface of the substrate 200 from being damaged by the subsequently process for removing the dummy gate electrode layer 231. Various processes may be used to form the dummy gate dielectric layer 230, such as a CVD process, a PVD process, a flowable CVD (FCVD) process, or a thermal oxidation process, etc. In one embodiment the dummy gate dielectric layer 230 is formed by a thermal oxidation process. The dummy gate dielectric layer 203 formed by the thermal oxidation process may be able to cause the dummy gate electrode layer 231 to have a better adhesion to the semiconductor substrate 200.

However, the equivalent oxide thickness (EOT) of the dummy gate dielectric layer 203 may be relatively large; it may not match the requirements of the device miniaturization. Further, when the dummy gate electrode layer 231 is subsequently removed, a portion of the dummy gate dielectric layer 203 may be unavoidably damaged; and the size of the dummy gate dielectric layer 203 may be difficult to control. Therefore, the dummy gate dielectric layer 230, especially the dummy gate dielectric layer 203 in the core region 201, may be subsequently removed; and a pad oxide layer matching the technical requirements may be subsequently formed. The pad oxide layer may be configured as an interfacial layer between a subsequently formed gate dielectric layer and the substrate 200 to ensure the subsequently formed transistor, especially the transistor in the core region 201, to have a stable performance.

Further, referring to FIG. 5, the sidewall spacer 232 may be formed on the side surface of the dummy gate dielectric layer 230 and the dummy gate electrode layer 231. The sidewall spacer 232 may be used to define the position of source/drain regions in the substrate 200 at both sides of the dummy gate structure 203.

The sidewall spacer 232 may be made of any appropriate material, such as one or more of silicon oxide, silicon nitride, and silicon oxynitride, etc. The sidewall spacer 232 may be a single layer structure and a multiple-stacked layer structure.

A process for forming the sidewall spacer 232 may include forming one or more sidewall spacer material layers on the substrate 200 and the side surfaces of the dummy gate dielectric layer 230 and the dummy gate electrode layer 231; and performing an etching back process onto the sidewall spacer material layer until the top surface of the dummy gate electrode layer 231 and the surface of the substrate 200 are exposed. The sidewall spacer material layer may be formed by any appropriate process, such as a CVD process, a PVD process, or an FCVD process, etc. The etch back process may be a dry etching process, a wet etching process, or an ion beam etching process, etc.

After forming the sidewall spacer 232, an ion implantation process may be performed to dope P-type or N-type ions into the substrate 200 at both sides of the dummy gate structures 203 to form source/drain regions (not labeled). After forming the source/drain regions, the dummy gate electrode layer 231 and the dummy gate dielectric layer 203 may be subsequently removed; and may be substituted by a high-K dielectric layer and a metal layer, thus a transistor with a HKMG structure may be formed. Such a process may be referred as a gate last process. That is, the gate electrode layer may be formed after forming the source/drain regions.

Figure 6:
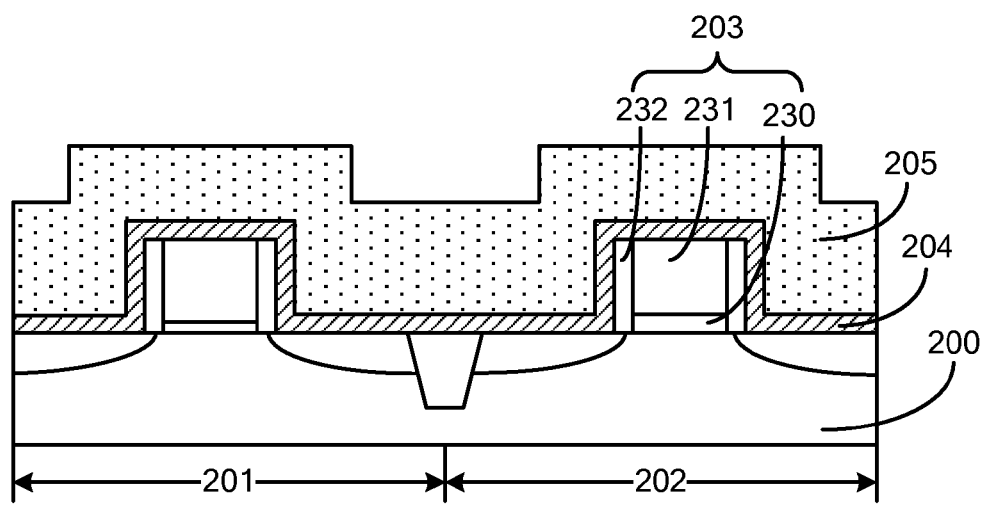

Returning to FIG. 14, after forming the dummy gate structures 203, a chemical etching stop film and a dielectric film may be formed (S102). FIG. 6 illustrates a corresponding semiconductor structure.

As shown in FIG. 6, a chemical etching stop film 204 is formed on the surface of the substrate 200; and a dielectric film 205 is formed on the chemical etching stop film 204. The surface of the dielectric film 205 may be slightly higher than, or may level with the top surface of the dummy gate electrode layer 231.

The dielectric film 205 may be used to subsequently form an interlayer dielectric layer. The interlayer dielectric layer may be used to isolate the gate electrode layer of the subsequently formed transistor. Further, the interlayer dielectric layer may keep the structure of the dummy gate electrode layer 231 and the dummy gate dielectric layer 230 such that a gate dielectric layer and a gate electrode layer may be formed in the interlayer dielectric layer after subsequently removing the dummy gate electrode layer 231 and the dummy gate dielectric layer 230.

Because, after subsequently forming a gate electrode layer and a gate dielectric layer, a conductive structure may be formed on the surface of the source/drain regions in the dielectric layer so as to obtain an electrical connection between the source/drain regions and the chip circuit, openings may need to be formed by an etching process to expose the source/drain regions, and the openings may be used to form the conductive structures. To protect the surface of the substrate 200 during the etching process, the chemical etching stop film 204 may need to be formed on the surface of the substrate 200. Further, the chemical etching stop film 204 may be made of a material different from the dielectric film 205 such that the chemical etching stop film 204 and the dielectric film 205 may have an etching selectivity.

The chemical etching stop film 204 may be made of any appropriate material, such as silicon oxide, silicon nitride, or silicon oxynitride, etc. In one embodiment, the chemical etching stop film 204 is made of silicon nitride.

The thickness of the chemical etching stop film 204 may be in any appropriate range. In one embodiment, the thickness of the chemical etching stop film 204 is in a range of approximate 50 Å~300 Å.

Various processes may used to form the chemical etching stop film 204, such as a CVD process, a PVD process, or an FCVD process, etc. In one embodiment, the chemical etching stop film 204 is formed by a CVD process. The temperature of the CVD process may be greater than approximately 480° C. Because the temperature of the CVD process may be relatively high, the density of the chemical etching stop film 204 formed by the CVD process may be significantly high. That is, the strength of the chemical etching stop film 204 formed by the CVD process may be relative high. When the dummy dielectric layer 203 is the core region 201 is subsequently removed, the top surface of the chemical etching stop film 204 may be not easy to be etched to form concave patterns. Correspondingly, the metal material for subsequently forming a gate electrode layer may not form residues on the top surface of the chemical etching stop film 204. Therefore, the performance of the transistor having such a chemical etching stop film 204 may be stable, and the leakage current may be avoided.

The dielectric film 205 may be made of a different material from the chemical etching stop film 204 so as to cause the chemical etching stop film 204 to have an etching selectivity with the dielectric film 205. Further, the dielectric constant of the dielectric film 205 may be significantly high so as to ensure acceptable electric insulation properties. Various materials may be used for the dielectric film 205, such as silicon oxide, silicon nitride, or silicon oxynitride, etc. In one embodiment, the dielectric film 205 is made of silicon oxide. The thickness of the dielectric film 205 may be in a range of approximately 300 Å~3000 Å. Referring to FIG. 6, in one embodiment, the surface of the dielectric film may be higher than, or level with the surface of the top surface of the dummy gate electrode layer 231. Therefore, after a subsequent planarization process, the surface of the interlayer dielectric layer formed from the dielectric film 205 may level with the surface of the dummy gate electrode layer 231.

In one embodiment, referring to FIG. 6, a plurality of dummy gate structures 203 may be formed on the surface of the substrate 200; and trenches between adjacent dummy gate structures 203 may expose the surface of the substrate 200, and/or the source/drain regions. When the size of the semiconductor devices and the chips is reduced, the size of the dummy gate structures 203 and the distance between adjacent dummy gate structures 203 may be correspondingly reduced so as that the density of the obtained transistors and the integration level may be increased.

However, although the width of the trenches between adjacent dummy gate structures 203 along the direction of the surface of the substrate 200 is reduced, the depth of the trenches (the height of the dummy gate structures 203) may not be changed. Therefore, the aspect ratio (AR), i.e., the depth to with ratio of the trenches between adjacent dummy gate structures 203 may be increased. When the dielectric film 205 is formed on the dummy gate structures 203 and the surface of the substrate 205, it may be difficult for the material of the dielectric film 205 to enter into the trenches, thus voids may be formed in the dielectric film 205; and the voids may cause semiconductor devices to be unstable.

Therefore, in one embodiment, a high aspect ratio process (HARP) may be used to form the dielectric film 205. The dielectric film 205 formed by the HARP may be significantly dense. The precursors of the HARP may include tetraethyl orthosilicate (TEOS) and ozone. The flow of TEOS may be smaller than approximately 1 gm; and the flow of ozone may be in a range of approximately 500 sccm~3000 sccm. The pressure of the HARP may be in a range of approximately 300 Torr~600 Torr; and the temperature of the HARP may be in a range of approximately 400° C.~600° C. Further, the source of the HARP may also include nitrogen, oxygen and helium, etc. The flow of nitrogen may be in a range of approximately 1000 sccm~10000 sccm; the flow of oxygen may be in a range of 0~5000 sccm; and the flow of helium may be in a range of approximately 5000 sccm~20000 sccm.

In the HARP, TEOS may be used to form silicon oxide; and ozone may be used to dilute and transport TEOS. Because the flow of TEOS may be relatively small, the forming rate of silicon oxide may be reduced. Therefore, the density of the formed dielectric film 205 formed by the HARP may be increased. That is, the strength of the dielectric film 205 may be enhanced. When the dummy gate dielectric layer 230 in the core region 201 is removed, damages to the dielectric film 205 may be significantly small. Further, the surface of the dielectric film 205 may be smooth and even, metal residues may not be formed on the surface of the dielectric film 205 after removing the subsequent formed metal material on the surface of the dielectric film 205. Therefore, a leakage current may be avoided, and the size and the morphology of the formed transistor may be precise and uniform.

Figure 7:
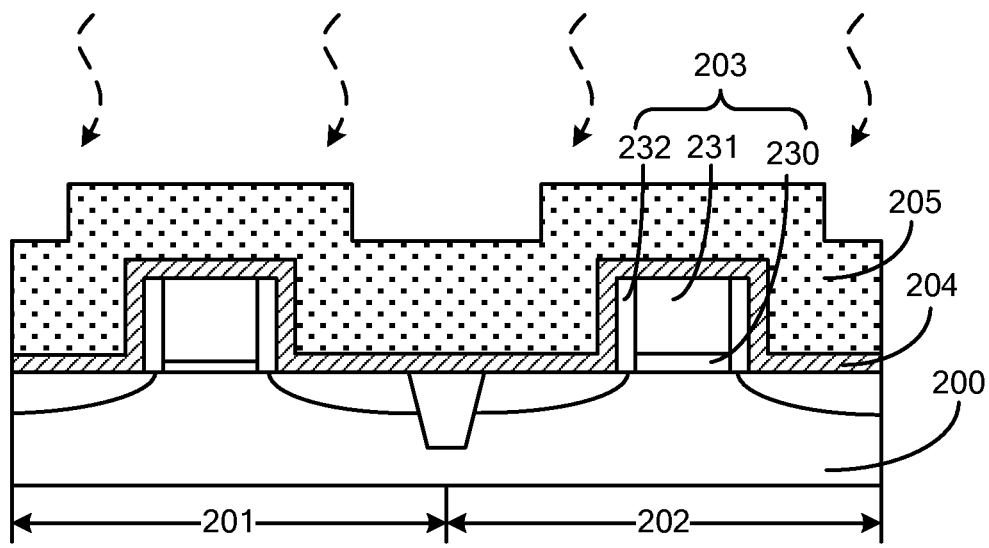

Returning to FIG. 14, after forming the chemical etching stop film 204 and the dielectric film 205, a thermal annealing process may be performed (S103). FIG. 7 illustrates a corresponding semiconductor structure.

As shown in FIG. 7, a thermal annealing process is performed onto the dielectric film 205. The thermal annealing process may cause the dielectric film 205 to be significantly dense.

The thermal annealing process may cause the molecules of the dielectric film 205 and the chemical etching stop film 204 to be significantly dense; and may be able to eliminate voids in the dielectric film 205 and the chemical etching stop film 204, thus the density of the dielectric film 205 and the chemical etching stop film 204 may be improved; and the strength of the subsequently formed interlayer dielectric layer and the chemical etching stop layer may be increased. The increased strength may prevent the dielectric layer and the chemical etching stop layer from being over etched; and/or forming concave defects on the top surface of the interlayer dielectric layer and the chemical etching stop layer after removing the dummy gate electrode layer 231 in the core region 201.

The thermal annealing process may be any appropriate thermal annealing process, such as a rapid thermal annealing process, a peak value annealing process, or a laser annealing process, etc. The temperature of the thermal annealing process may be greater than approximately 800° C. The thermal annealing temperature greater than 800° C. may be able to increase the density of the dielectric film 205 and the chemical etching stop film 204. In one embodiment, the thermal annealing process is a laser annealing process. The laser annealing process may have a precise temperature control; and may precisely focus the annealing position. Further, the annealing time of the laser annealing process may be relatively short.

Figure 8:
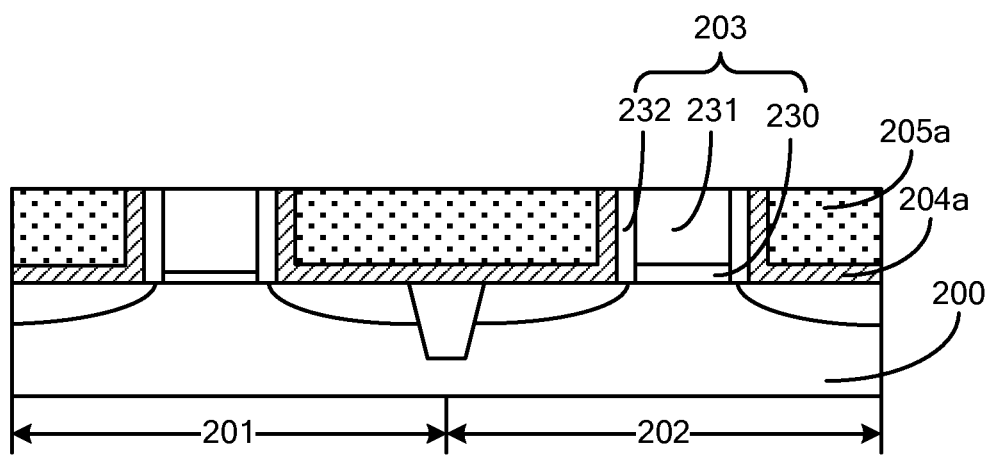

Returning to FIG. 14, after the thermal annealing process, a planarization process may be performed (S104). FIG. 8 illustrates a corresponding semiconductor structure.

As shown in FIG. 8, a planarization process is performed onto the dielectric film 205 and the chemical etching process stop film 204 until the top surface of the dummy gate electrode layer 231 is exposed. The planarization process may include planarizing the dielectric film 205 until the top surface of the chemical etching stop film 204 is exposed. The polarization process may also include planarizing the dielectric layer 205 and the chemical etching stop film 204 until the top surface of the dummy gate electrode layer 231 is exposed. Thus, an interlayer dielectric (ILD) layer 205a and a chemical etching stop layer (CESL) 204a may be formed.

The planarization process may include any appropriate process, such as a chemical mechanical polishing (CMP) process, a mechanical polishing process, or an ion beam polishing process, etc. In one embodiment, the planarization process is a chemical mechanical polishing process. The planarization process may expose the dummy gate electrode layer 231; and the dummy gate electrode layer 231 may be subsequently removed. During the CMP process, the dielectric film 205 and the chemical etching stop layer 204 may have a polishing selectivity, thus the chemical etching stop film 204 may define the stop position of the CMP process. That is, the CMP process may stop when the chemical etching stop film 204 is exposed firstly, the polishing solution of the CMP process may then be changed to adapt to the chemical etching stop film 204; and the CMP process may continue on the chemical etching stop film 204 until the top surface of the dummy gate electrode layer 231 is exposed.

In certain other embodiments, after the surface of the chemical etching stop film 204 is exposed, an etching process may be performed to remove a portion of the chemical etching stop film 204 on the top surface of the dummy gate electrode layer 231, thus the CESL 204a may be formed. The etching process may be a dry etching process, a wet etching process, or an ion beam etching process, etc.

Figure 9:
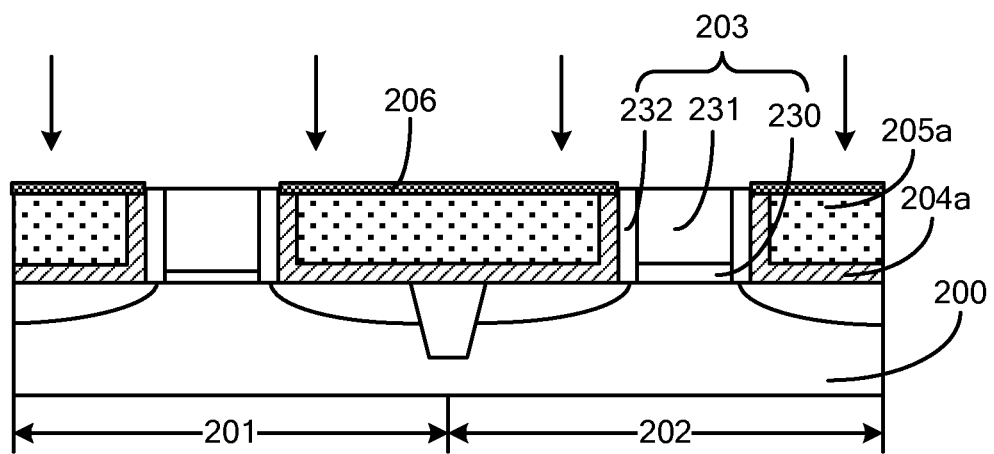

Returning to FIG. 14, after forming the ILD layer 205a and the CESL 204a, a dense layer may be formed (S105). FIG. 9 illustrates a corresponding semiconductor structure.

As shown in FIG. 9, a dense layer 206 is formed on the surface of the ILD layer 205a. Further, the dense layer 206 is also formed on the exposed top surface of the CESL 204a. The dense layer 206 may be used to protect the surface of the ILD layer 205a and the exposed surface of the CESL 204a during a subsequent process for removing the dummy gate dielectric layer 203 in the core region 201.

The dense layer 206 may be formed by any appropriate process. In one embodiment, the dense layer 206 is formed by an ion implantation process. In one embodiment, because the ILD layer 205a may be made of silicon oxide and the CESL 204a may be made of silicon nitride, the ions for the ion implantation process are silicon ions. The silicon ion implantation may cause the dense layer 206 on the ILD layer 205a to be a silicon-rich silicon oxide layer; and the dense layer 206 on the CESL 204a to be a silicon-rich silicon nitride layer. The dose of the ion implantation process may be greater than approximately 1E15 atom/cm$^3$. The energy of the ion implantation process may be in a range of approximately 0.5 KeV~3 KeV. The thickness of the dense layer 206 may be in a range of approximately 10 Å~30 Å.

When the silicon ions are implanted into the surface of the ILD layer 205a and the exposed surface of the CESL 204a, a dense layer 206 with an acceptable strength may be formed and may be used as a protective layer for subsequently removing the dummy gate dielectric layer 230. Further, the implanted silicon ions may also be able to repair damages, cavities and/or voids in the ILD layer 205a and the CESL 204a cause by previous processes. Thus, the surface of the dense layer 206 may be smooth and even. The surface of the dense layer 206 may be still smooth and even after subsequently removing the dummy gate dielectric layer 203, thus it may avoid forming metal residues on the surface of the dense layer 206 when the gate electrode layer is subsequently formed. Therefore, a leakage current between adjacent subsequently formed transistors may be avoided; and the size of the subsequently formed gate electrode layer may be precise and even.

Figure 10:
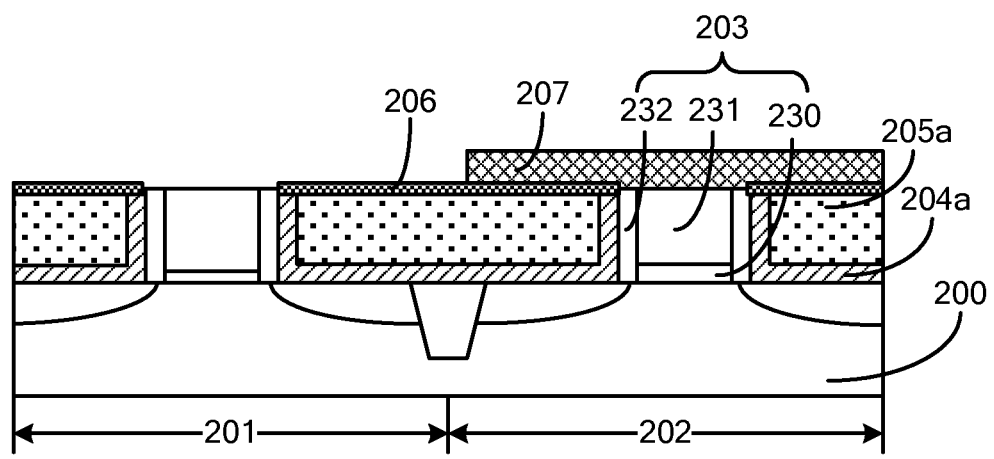

Returning to FIG. 14, after forming the dense layer 206, a mask layer may be formed (S106). FIG. 10 illustrates a corresponding semiconductor structure.

As shown in FIG. 10, a mask layer 207 is formed on the surface of the ILD layer 205a and the dummy gate electrode layer 203 in the peripheral region 202. The mask layer 207 may expose the dummy gate electrode layer 231 in the core region 201.

In one embodiment, it may need to remove both the dummy gate electrode layer 231 and the dummy gate dielectric layer 203 in the core region 202 for forming a transistor; and it may only need remove the dummy gate electrode layer 231 in the peripheral region 202 for forming a transistor, thus it may need to form the mask layer 207 on the surface of the ILD layer 205a and the dummy gate structure 203 to expose the core region 201; and the mask layer 207 may be used as a mask layer for subsequently removing the dummy gate electrode layer 231 and the dummy gate dielectric layer 230 in the core region 201.

The mask layer 207 may be any appropriate type of masks, such as a hard mask, or a photoresist mask, etc. In one embodiment, the mask layer 207 is a photoresist mask. A process for forming the mask layer 207 made of photoresist may include sequentially forming a photoresist layer on the surface of the ILD layer 205a and the surface of the dummy gate structure 203 by a spin-coating process; and exposing and developing the photoresist layer to expose the surface of the dummy gate electrode layer 231 and ILD layer 205a in the core region 201.

Figure 11:
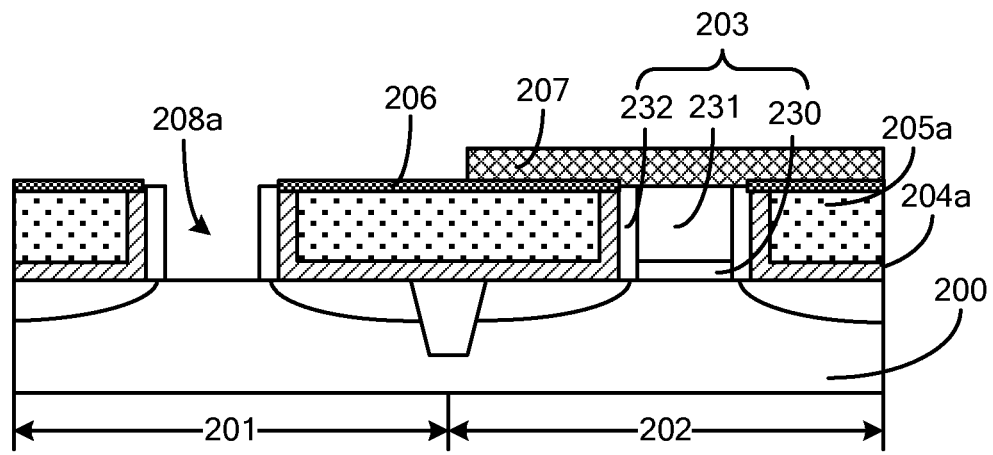

Returning to FIG. 14, after forming the mask layer 207, the dummy gate electrode layer 231 and the dummy gate dielectric layer 230 in the core region 201 may be removed (S107). FIG. 11 illustrates a corresponding semiconductor structure.

As shown in FIG. 11, the dummy gate electrode layer 231 and the dummy gate dielectric layer 230 in the core region 201 are removed. Thus, a first opening 208a may be formed.

The dummy gate electrode layer 231 and the dummy gate dielectric layer 230 in the core region 201 may be removed by any appropriate processes, such as a dry etching process, a wet etching process, or an ion beam etching process, etc. The dry etching process may be an anisotropic dry etching process, or an isotropic dry etching process. In one embodiment, the etching gas of the dry etching process may include one or more of $Cl_2$ and HBr, etc. In certain other embodiments, an etching solution of the wet etching process may be $HNO_3$.

After removing the dummy gate electrode layer 231, the dummy gate dielectric layer 230 may be exposed. Because the dummy gate dielectric layer 230 may be made of silicon oxide, and formed by a thermal annealing process, the equivalent oxide thickness of the dummy gate dielectric layer 230 made of thermal oxide may not match the requirements for forming transistors with HKMG structures. Further, after removing the dummy gate electrode layer 231, it is unavoidable for the dummy gate dielectric layer 230 to be damaged by the etching process, thus the thickness of the dummy gate dielectric layer 230 may be uneven. The core region 201 may have significantly strict requirements for the precision of the device performance and stability, thus it may need to remove the dummy gate dielectric layer 230 in the core region 201 before subsequent forming a high-K dielectric layer with a precise thickness and quality control.

In one embodiment, the dummy gate dielectric layer 230 may be removed by a wet etching process. The wet etching process may rapidly remove the dummy gate dielectric layer 230 completely. Further, the wet etching process may generate significantly few damages to the surface of the substrate 200; and fewer damages may aid to subsequently form a gate dielectric layer on the surface of the substrate 200.

The ILD layer 205a may be made of silicon oxide, but a thermal annealing process may be performed before planarizing the dielectric film 205, thus the strength of the ILD layer 205a may be improved; and the etching rate to the ILD layer 205a may be significantly small when the dummy gate dielectric layer 230 is removed by an etching process. Further, after the planarization process and before removing the dummy gate electrode layer 231, a dense layer 206 may be formed on the ILD layer 205a by a silicon ion implantation process.

The dense layer 206 may repair the voids and/or damages on the surface of the ILD layer 205a; and the density of the dense layer 206 may be significantly high. Therefore, the dense layer 206 may be able to protect the surface of the ILD layer 205a and the CESL 204a during the etching process for removing the dummy gate dielectric layer 230. Further, the etching rate of the etching process to the dense layer 206 may be uniform, thus the surface of the ILD layer 205a and the CESL 204a protected by the dense layer 206 may keep smooth and even after the etching process. Therefore, when a gate electrode layer is subsequently formed, it may be unlikely to form residual metal material of the gate electrode layer on the top surface of the CESL 204a and the surface of the ILD layer 205a.

In certain other embodiments, a dry etching process may be used to remove the dummy gate dielectric layer 230. Because the dummy gate dielectric layer 230 may be made of silicon oxide, the etching gas may include one or more of $CHF_3$, $CF_4$ and HF, etc.

Returning to FIG. 14, after forming the first opening 208a, the mask layer 207 may be removed, and the dummy gate electrode layer 231 in the peripheral region 202 may be removed (S108). FIG. 12 illustrates a corresponding semiconductor structure.

As shown in FIG. 12, the mask layer 207 is removed; the dummy gate electrode layer 231 in the peripheral region 202 is also removed; and a second opening 208b is formed in the ILD layer 205a. The second opening 208b may expose the dummy gate dielectric layer 230 in the peripheral region 202.

The mask layer 207 may be made of photoresist, thus the mask layer 207 may be removed by a dry etching process, a wet etching process, or a plasma ashing process, etc. After removing the photoresist layer, the dummy gate electrode layer 231 in the peripheral region 202 may be exposed. Then the dummy gate electrode layer 231 may be removed, and the second opening 208b may be formed. The second opening 208b may be used to subsequently form the gate dielectric layer and the gate electrode layer of the transistor in the peripheral region 202. The transistor in the peripheral region 202 may be used in the input/output circuits of a chip.

The dummy gate electrode layer 231 may be removed by any appropriate process, such as a dry etching process, or a wet etching process, etc. The dry etching process may an isotropic dry etching process, or an anisotropic dry etching process. In one embodiment, the dummy gate electrode layer may be made of poly silicon, thus the etching gas of the dry etching process may include one or more of $Cl_2$ and HBr, etc. In certain other embodiment, the etching solution of the wet etching process may be $HNO_3$.

Returning to FIG. 14, after removing the mask layer 207 and the dummy gate electrode layer 231 in the peripheral region 202, a gate dielectric layer and a gate electrode layer may be formed (S109). FIG. 13 illustrates a corresponding semiconductor structure.

As shown in FIG. 13, a gate dielectric layer 209 is formed in the first opening 208a and the second opening 208b. Further, a gate electrode layer 210 is formed on the surface of the gate dielectric layer 210; and the surface of the gate electrode layer 210 may level with the top surface of the ILD layer 205a.

A process for forming the gate dielectric layer 209 and the gate electrode layer 210 may include sequentially forming a gate dielectric film on the surface of the ILD layer 205a, the surface of the CESL 204a and the side and bottom surfaces of the first opening 208a and the second opening 208b; forming a gate electrode film on the on the gate dielectric film to fill the first opening 208a and the second opening 208b; planarizing the gate dielectric film and the gate electrode film until the ILD layer 205a or the dense layer 206 is exposed. Thus, the gate electrode layer 210 may be formed from the gate electrode film; and the gate dielectric layer 209 may be formed from the gate dielectric film.

The gate dielectric film may be a high-K material, such as $HfO_2$, $ZrO_2$, $La_2O_3$, $SiZrO_3$, $Ta_2O_5$, $BaSrTiO_3$, $BaTiO_3$, $SrTiO_3$, $Al_2O_3$, HfSiON, or $HfAlO_3$, etc. Various processes may be used to form the gate dielectric film, such as a CVD process, a PVD process, or an FCVD, etc.

The gate electrode film may be made of any appropriate metal, such as Cu, W or Al, etc. Various processes may be used to form the gate electrode film, such as a CVD process, a PVD process, a sputtering process, or an electroplating process, etc The planarization process may include a CMP process, a mechanical polishing process, or an ion beam polishing process, etc. In one embodiment, the gate dielectric film and the gate electrode film is planarized by a CMP process.

Optionally, in order to increase the adhesion force between the gate dielectric film and the substrate 200, a pad oxide layer (not labeled) may be formed on the bottom surface of the first opening 208a. The gate dielectric film in the core region 201 may be formed on the pad oxide layer. The pad oxide layer may be made of silicon oxide; and may be formed by a CVD process, or an FCVD process. The thickness of the pad oxide layer formed by the (F)CVD process may be uniform; and may have a relative small equivalent oxide thickness. Thus, the pad oxide layer may match the technological requirements for forming transistors with HKMG structures.

Thus, a semiconductor structure may be formed by above disclosed methods and processes; and the corresponding semiconductor is illustrated in FIG. 13. As shown in FIG. 13, the semiconductor structure includes a substrate 200 having a core region 201 and a peripheral region 202 and transistors (not labeled) formed in the first region 201 and the second region 202, respectively. The transistor in the first region 201 includes a pad oxide layer (not labeled) formed on the surface of the substrate 200, a gate dielectric layer 209 formed on the pad oxide layer and a gate electrode layer 210 formed on the gate dielectric layer 209.

The transistor in the peripheral region 202 includes a dummy gate dielectric layer 230 formed on the surface of the substrate 200, the gate dielectric layer 209 formed on the dummy gate dielectric layer 230; and the gate electrode layer 210 formed on the gate dielectric layer 209.

The semiconductor structure also includes a sidewall spacer 232 formed on the side surface of the gate dielectric layer 209 and the gate electrode layer 210, and a chemical etching stop layer 204a formed on the surface of the substrate 200 and the side surface of the sidewall spacer 232. Further, the semiconductor structure also includes an interlayer dielectric layer 205a formed on the chemical etching stop layer 204a and a dense layer 206 formed on the interlayer dielectric layer 205a. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating transistors, comprising:
   providing a substrate;
   forming at least one dummy gate structure having a dummy gate dielectric layer formed on the substrate and a dummy gate electrode layer formed on the dummy gate dielectric layer on the substrate;
   forming a dielectric film on a surface of the substrate and a top surface of the dummy gate structure;
   increasing the density of the dielectric film by performing a thermal annealing process onto the dielectric film;
   planarizing the dielectric film having the increased density until the top surface of the dummy gate structure is exposed;
   forming a dense layer having an increased density on the dielectric film;
   removing the dummy gate dielectric layer and the dummy gate electrode layer to form an opening; and
   forming a gate dielectric layer and a gate electrode layer sequentially in the opening.

2. The method according claim 1, before forming the dielectric film, further including:
   forming a chemical etching stop film on the surface of the substrate and the dummy gate structure.

3. The method according claim 2, after planarizing the dielectric film with the increased density, further including,
   removing a portion of the chemical etching stop film on the top surface of the dummy gate structure to expose the dummy gate electrode layer and form a chemical etching stop layer.

4. The method according claim 2, wherein:
   the chemical etching stop film is made of silicon nitride;
   the density of the chemical etching stop film is increase after the thermal annealing process;
   a thickness of the chemical stop film is in a range of approximately 50 Å~300 Å;
   the chemical etching stop film is formed by a chemical vapor deposition process; and
   a temperature of the chemical vapor deposition process is greater than 480° C.

5. The method according to claim 1, wherein forming the dummy gate structure further includes:
   forming a sidewall spacer around the dummy gate structure.

6. The method according to claim 1, wherein:
   the dielectric film is made of silicon oxide;
   the dielectric film is formed by a high aspect ratio process;
   a precursor gas for forming the dielectric film using the high aspect ratio process is tetraethyl orthosilicate; and
   a flow of tetraethyl orthosilicate is smaller than 1 gm.

7. The method according to claim 1, wherein:
   the dense layer having the increased density is formed by an ion implantation process;
   ions of the ion implantation process are silicon ions;
   a dose of the ion implantation process is greater than 1E15 atom/cm$^3$; and
   an energy of the ion implantation process is in a range of approximately 0.5 KeV~3 KeV.

8. The method according to claim 1, wherein:
   the thermal annealing process is a rapid thermal annealing process, a peak annealing process or a laser annealing process; and
   a temperature of the thermal annealing process is greater than approximately 800° C.

9. The method according to claim 1, wherein:
   the substrate has a core region and a peripheral region;
   dummy gate structures are formed in the core region and the peripheral region, respectively; and
   source/drain regions are formed in the substrate at both sides of the dummy gate structure.

10. The method according to claim 9, after forming the dense layer, further including:
    forming a mask layer on the dielectric film and the dummy gate structure in the peripheral region to expose the dummy gate electrode layer in the core region;
    removing the dummy gate electrode layer and the dummy gate dielectric layer in the core region to form a first opening in the interlayer dielectric layer; and
    removing the mask layer and the dummy gate electrode layer in the peripheral region to form a second opening.

11. The method according to claim 10, before forming the gate dielectric layer, further including:
    forming a pad oxide layer on a bottom surface of the first opening.

12. The method according to claim 1, wherein:
    the gate electrode layer is made of metal material; and
    the gate dielectric layer is made of high dielectric constant material.

13. The method according to claim 1, wherein
    the dummy gate layer is made of poly silicon; and
    the dummy gate dielectric layer is made of silicon oxide.

14. The method according to claim 13, wherein:
    the dummy gate dielectric layer is formed by a thermal oxidation process.

15. The method according to claim 13, wherein:
    the dummy gate dielectric layer is removed by a wet etching process.

* * * * *